US009721979B1

(12) United States Patent
Liu et al.

(10) Patent No.: US 9,721,979 B1
(45) Date of Patent: Aug. 1, 2017

(54) METHOD FOR MANUFACTURING ARRAY SUBSTRATE, ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Zheng Liu, Beijing (CN); Tsung Chieh Kuo, Beijing (CN); Xi Chen, Beijing (CN); Xiaoxiang Zhang, Beijing (CN); Zhichao Zhang, Beijing (CN); Mingxuan Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/106,052

(22) PCT Filed: Jan. 14, 2016

(86) PCT No.: PCT/CN2016/070855
§ 371 (c)(1),
(2) Date: Jun. 17, 2016

(87) PCT Pub. No.: WO2017/012306
PCT Pub. Date: Jan. 26, 2017

(30) Foreign Application Priority Data

Jul. 17, 2015 (CN) .......................... 2015 1 0424976

(51) Int. Cl.
*H01L 21/00* (2006.01)
*H01L 21/84* (2006.01)
(Continued)

(52) U.S. Cl.
CPC .... *H01L 27/1288* (2013.01); *H01L 29/66765* (2013.01); *G02F 1/1368* (2013.01);
(Continued)

(58) Field of Classification Search
CPC ..................... H01L 27/1288; H01L 29/66765
(Continued)

(56) References Cited

U.S. PATENT DOCUMENTS 7,760,309 B2 * 7/2010 Ahn .................. G02F 1/133555
349/141

FOREIGN PATENT DOCUMENTS

| CN | 1707340 A | 12/2005 |
| CN | 105070684 A | 11/2015 |
| EP | 2 023 194 A1 | 2/2009 |

OTHER PUBLICATIONS

International Search Report dated Apr. 11, 2016 issued in corresponding International Application No. PCT/CN2016/070855 along with an English translation of the Written Opinion of the International Searching Authority.

* cited by examiner

*Primary Examiner* — David S Blum
(74) *Attorney, Agent, or Firm* — Nath, Goldberg & Meyer; Joshua B. Goldberg

(57) ABSTRACT

A method for manufacturing an array substrate comprises: forming a pixel electrode and a gate of a thin film transistor on a substrate; forming a gate insulating layer; forming an active layer and a source and a drain, which are provided on the active layer, of the thin film transistor by a patterning process; forming a passivation layer; forming a main via penetrating through the gate insulating layer and the passivation layer and a main-via extension portion under a portion of the drain by a patterning process, wherein the main via is connected to the main-via extension portion;

(Continued)

removing a portion of the drain which protrudes above the main-via extension portion so as to form a final via; and forming a connection electrode and a common electrode, wherein the connection electrode electrically connects the drain to the pixel electrode through the final via.

20 Claims, 4 Drawing Sheets

(51) Int. Cl.
  *G02F 1/1343* (2006.01)
  *H01L 27/12* (2006.01)
  *H01L 29/66* (2006.01)
  *G02F 1/1368* (2006.01)
  *G02F 1/1333* (2006.01)

(52) U.S. Cl.
  CPC .... *G02F 1/13439* (2013.01); *G02F 1/133345* (2013.01); *G02F 1/134309* (2013.01); *G02F 2001/134318* (2013.01); *G02F 2201/121* (2013.01); *G02F 2201/123* (2013.01)

(58) Field of Classification Search
  USPC .......................................... 438/158; 349/141
  See application file for complete search history.

METHOD FOR MANUFACTURING ARRAY SUBSTRATE, ARRAY SUBSTRATE AND DISPLAY DEVICE

This is a National Phase Application filed under 35 U.S.C. 371 as a national stage of PCT/CN2016/070855, filed on Jan. 14, 2016, an application claiming the benefit of Chinese Application No. 201510424976.6, filed on Jul. 17, 2015, the content of each of which is hereby incorporated by reference in its entirety.

FIELD OF THE INVENTION

The present invention relates to the field of display technology, and in particular, relates to a method for manufacturing an array substrate, an array substrate and a display device.

BACKGROUND OF THE INVENTION

A thin film transistor liquid crystal display (TFT-LCD for short) is an important flat panel display device. According to a direction of an electric field driving liquid crystal molecules, TFT-LCDs may be classified into vertical electric field type TFT-LCDs and horizontal electric field type TFT-LCDs. For a vertical electric field type TFT-LCD, a pixel electrode needs to be formed on an array substrate, and a common electrode needs to be formed on a color-filter substrate, as in the case of commonly used TN mode. For a horizontal electric field type TFT-LCD, both a pixel electrode and a common electrode need to be formed on an array substrate, as in the case of advanced super dimension switch (ADS) mode. The ADS technology is a core technology of planar electric field having wide viewing angle, and the main concept thereof is as follows: a multi-dimensional electric field is formed by an electric field generated by edges of slit electrodes in a same plane and an electric field generated between a slit electrode layer and a plate electrode layer, so as to allow all liquid crystal molecules having various orientations between the slit electrodes and right above the electrodes in a liquid crystal cell to rotate, thereby increasing both the operation efficiency of the liquid crystal molecules and the light transmittance thereof. The ADS technology can improve the picture quality of a TFT-LCD product, and has advantages such as high resolution, high light transmittance, low power consumption, wide viewing angle, high aperture ratio, low chromatic aberration, no push Mura, and the like. For various applications, technologies such as a high light transmittance ADS (I-ADS) technology, a high aperture ratio ADS (H-ADS) technology, a high resolution ADS (S-ADS) technology, and the like have been developed as improvements on the ADS technology.

An I-ADS mode array substrate is described below in conjunction with the following manufacturing method.

Step 1 includes: forming a first transparent conductive layer on a substrate, and forming a pattern including a pixel electrode (a plate electrode) by a patterning process.

Step 2 includes: forming a gate metal film on the substrate subjected to the above step, and forming a pattern including a gate of a thin film transistor by a patterning process.

Step 3 includes: forming a gate insulating layer on the substrate subjected to the above steps.

Step 4 includes: forming an active-layer film on the substrate subjected to the above steps, and forming a pattern including an active layer by a patterning process.

Step 5 includes: forming a source-drain metal film on the substrate subjected to the above steps, and forming a pattern including a source and a drain by a patterning process.

Step 6 includes: forming a passivation layer on the substrate subjected to the above steps, and forming a pattern including a main via penetrating through the passivation layer and the gate insulating layer by a patterning process.

Step 7 includes: forming a second transparent conductive layer on the substrate subjected to the above steps, and forming, by a patterning process, a connection electrode which connects the drain to the pixel electrode through the main via, and forming a common electrode (a slit electrode) by a patterning process.

The inventors of the present invention found that at least the following problem exists in the prior art: since a dry etching process is commonly used for forming the main via in the step 6, the source-drain metal film will not be etched, whereas the active layer will be etched due to that its material is generally polysilicon, amorphous silicon, or the like, resulting in a problem of undercut occurring under the drain. It is apparent that, due to the phenomenon of undercut occurring under the drain, the second transparent conductive layer formed subsequently tends to break at a position where the undercut occurs.

SUMMARY OF THE INVENTION

In view of the defect existing in the prior art, the present invention provides a method for manufacturing an array substrate, an array substrate and a display device, which effectively eliminate the problem of undercut occurring under a drain.

Embodiments of the present invention provide a method for manufacturing an array substrate, including:

step S1, forming a pattern including a pixel electrode on a substrate;

step S2, forming a pattern including a gate of a thin film transistor on the substrate after the step S1;

step S3, forming a gate insulating layer on the substrate after the step S2;

step S4, forming a pattern including an active layer and a source and a drain, which are provided on the active layer, of the thin film transistor on the substrate by a patterning process after the step S3;

step S5, forming a passivation layer on the substrate after the step S4;

step S6, forming, on the substrate, a pattern including a main via penetrating through the gate insulating layer and the passivation layer and a main-via extension portion under a portion of the drain by a patterning process after the step S5, wherein the main via is connected to the main-via extension portion;

step S7, removing a portion of the drain which protrudes above the main-via extension portion after the step S6 so as to form a pattern including a final via; and step S8, forming a pattern including a connection electrode and a common electrode on the substrate after the step S7, wherein the connection electrode electrically connects the drain to the pixel electrode through the final via.

For example, the array substrate includes a thin film transistor region, a common electrode region and a via region between the thin film transistor region and the common electrode region, and the step S6 includes steps of:

forming a layer of first photoresist on the substrate on which the passivation layer is formed;

exposing the layer of first photoresist with a halftone mask or a grayscale mask such that the layer of first photoresist is divided into a first photoresist completely removed region, a first photoresist completed remaining region and a first photoresist partially remaining region, wherein, the first photoresist completely removed region corresponds to a central portion of the via region, the first photoresist partially remaining corresponds to a portion, which is close to the via region, of a drain region of the thin film transistor region and a peripheral region, which is close to the thin film transistor region, of the via region, the first photoresist completely remaining region corresponds to the remaining region, after development is performed, a thickness of the first photoresist in the first photoresist completely remaining region remains unchanged, the first photoresist in the first photoresist completely removed region is removed completely, and a thickness of the first photoresist in the first photoresist partially remaining region is decreased;

removing portions, which are under the first photoresist completely removed region, of the passivation layer and the gate insulating layer by an etching process;

removing, by an ashing process, the first photoresist in the first photoresist partially remaining region, so as to expose a portion, which is under the first photoresist partially remaining region, of the passivation layer and the peripheral region, which is close to the thin film transistor region, of the via region;

removing portions, which are under the first photoresist partially remaining region, of the passivation layer, the active layer and the gate insulating layer by an etching process, so as to form the pattern including the main via and the main-via extension portion; and removing the remaining first photoresist.

The layer of first photoresist may have a thickness ranging from 2.2 μm to 2.5 μm.

For example, the step of removing portions, which are under the first photoresist completely removed region, of the passivation layer and the gate insulating layer by an etching process and the step of removing portions, which are under the first photoresist partially remaining region, of the passivation layer, the active layer and the gate insulating layer by an etching process are each performed by a dry etching process.

For example, the step S7 includes a step of:

removing, by a single patterning process, the portion of the drain protruding above the main-via extension portion so as to form the pattern including the final via, on the substrate provided with the pattern including the main via and the main-via extension portion.

For example, the step S8 includes steps of:

forming a transparent conductive film, and forming the pattern including the connection electrode and the common electrode by a single patterning process.

For example, the common electrode region includes a first region and a second region arranged alternately, and the step S8 includes steps of:

forming a layer of second photoresist on the substrate provided with the pattern including the main via and the main-via extension portion;

exposing the layer of second photoresist with a halftone mask or a grayscale mask such that the layer of second photoresist is divided into a second photoresist completely removed region, a second photoresist completely remaining region and a second photoresist partially remaining region, wherein, the second photoresist completely removed region corresponds to a source region of the thin film transistor region, the via region and the second region of the common electrode region, the second photoresist partially remaining region corresponds to a drain region of the thin film tran-sistor region, the second photoresist completely remaining region corresponds to the remaining region including the first region, after development is performed, a thickness of the second photoresist in the second photoresist completely remaining region remains unchanged, the second photoresist in the second photoresist completely removed region is removed completely, and a thickness of the second photoresist in the second photoresist partially remaining region is decreased;

removing a portion, which protrudes above the main-via extension portion, of the drain by an etching process, so as to form the pattern including the final via;

removing, by an ashing process, the second photoresist in the second photoresist partially remaining region;

forming a transparent conductive film on the substrate after the step of removing, by an ashing process, the second photoresist in the second photoresist partially remaining region; and removing the remaining second photoresist by a stepped stripping process, and forming the pattern including the connection electrode and the common electrode.

The layer of second photoresist may have a thickness ranging from 2.5 μm to 3.0 μm.

For example, the step S4 includes steps of:

depositing an active-layer film and a source-drain metal film sequentially; and forming the pattern including the active layer and the source and the drain, which are provided on the active layer, of the thin film transistor by a single patterning process using a grayscale mask or a halftone mask.

Alternatively, the step S4 may include steps of:

depositing an active-layer film, and forming a pattern including the active layer of the thin film transistor by a patterning process; and depositing a source-drain metal film, and forming a pattern including the source and the drain of the thin film transistor by another patterning process.

Embodiments of the present invention further provide an array substrate, which is manufactured by the method for manufacturing an array substrate as described above.

Embodiments of the present invention further provide a display device, which includes the array substrate as described above.

The advantageous effects of the present invention are as follows.

In the method for manufacturing an array substrate according to the present invention, by forming the pattern including the main via penetrating through the gate insulating layer and the passivation layer and the main-via extension portion under a portion of the drain, and effectively removing a portion of a drain metal protruding out of the main-via extension portion in a subsequent step, the problem of undercut occurring under a drain in the prior art is solved without adding any process step, and the manufactured array substrates have a better performance and a higher yield.

DETAILED DESCRIPTION OF THE EMBODIMENTS

Figure 1:
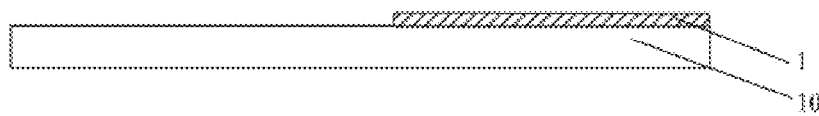
FIG. 1 is a schematic diagram showing step S1 of a method for manufacturing an array substrate according to a first embodiment of the present invention.

To make those skilled in the art better understand the technical solutions of the present invention, the present invention will be described in detail below with reference to the accompanying drawings and the following specific embodiments.

A first embodiment of the present invention will be described first.

As shown in FIGS. 1 to 9, the present embodiment provides a method for manufacturing an array substrate. The array substrate is an I-ADS mode array substrate, and at least includes a thin film transistor and a pixel electrode 1 thereon, wherein the thin film transistor may be a top-gate type thin film transistor or a bottom-gate type thin film transistor. A person skilled in the art could understand that, the main difference between the top-gate type thin film transistor and the bottom-gate type thin film transistor lies in that a gate 2 and an active layer 4 are provided in different positions. Specifically, a thin film transistor in which the active layer 4 is provided under the gate 2 is a top-gate type thin film transistor, whereas a thin film transistor in which the active layer 4 is provided above the gate 2 is a bottom-gate type thin film transistor. Most of the existing array substrates employ bottom-gate type thin film transistors, because the metal gate 2 of a bottom-gate type thin film transistor can serve as a protection layer of a semiconductor active layer 4 to prevent light emitted from a backlight from irradiating onto photon-generated carriers generated by an amorphous silicon layer to degrade the electrical characteristics of the active layers 4. Thus, the following description is given by taking a method for manufacturing an array substrate including a bottom-gate type thin film transistor as an example. However, this method does not constitute limitation to the present invention, and is also suitable for manufacturing an array substrate including a top-gate type thin film transistor.

In the present embodiment, a patterning process may include a photolithography process only, or may include a photolithography process and an etching step, and may further include other process for forming a predetermined pattern, such as a printing process, an inkjet process, etc. The photolithography process refers to a process that forms a pattern by processes such as film forming, exposure, development, and the like using a photoresist, a mask, an exposure machine, etc. Corresponding patterning processes may be selected according to a structure to be formed in the present embodiment.

The method for manufacturing an array substrate according to the present embodiment specifically includes the following steps S1 to S8.

In step S1, a pattern including a pixel electrode 1 is formed on a substrate 10 by a patterning process.

Specifically, in this step, the substrate 10 may be made of a transparent material such as glass, resin, sapphire, quartz, or the like, and may be pre-cleaned. In this step, a first transparent conductive film may be formed by means of sputtering, thermal evaporation, plasma enhanced chemical vapor deposition (PECVD), low pressure chemical vapor deposition (LPCVD), atmospheric pressure chemical vapor deposition (APCVD), or electron cyclotron resonance chemical vapor deposition (ECR-CVD), and then photoresist coating, exposure, development, etching and photoresist stripping are performed on the first transparent conductive film so as to form the pattern including the pixel electrode 1, as shown in FIG. 1.

Here, the first transparent conductive film has a high reflectivity, meets certain work function requirement, and generally has a structure of two or three film layers, such as ITO (indium tin oxide)/Ag (silver)/ITO or Ag/ITO. Alternatively, ITO in the above structures may be replaced by IZO (indium zinc oxide), IGZO (indium gallium zinc oxide) or InGaSnO (indium gallium tin oxide). Of course, the first transparent conductive film may also be made of an inorganic metal oxide, an organic conductive polymer or a metallic material electrically conductive and having a high work function value, the inorganic metal oxide includes indium tin oxide or zinc oxide, the organic conductive polymer includes PEDOT:PSS or PANI (polyaniline), and the metallic material includes one or more of gold, copper, silver and platinum.

Figure 2:
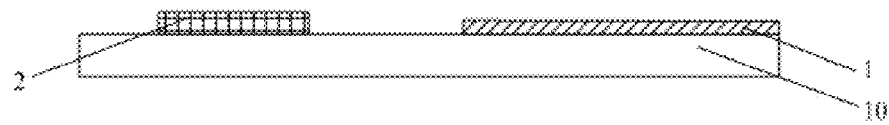
FIG. 2 is a schematic diagram showing step S2 of the method for manufacturing an array substrate according to the first embodiment of the present invention.

In step S2, on the substrate 10 after the step S1, a pattern including the gate 2 of a thin film transistor is formed by a patterning process, as shown in FIG. 2.

Specifically, in this step, a gate metal film may be formed by means of sputtering, thermal evaporation, plasma enhanced chemical vapor deposition, low pressure chemical vapor deposition, atmospheric pressure chemical vapor deposition, or electron cyclotron resonance chemical vapor deposition, and then photoresist coating, exposure, development, etching and photoresist stripping are performed on the gate metal film so as to form the pattern including the gate 2 of the thin film transistor.

Here, the gate metal film (the gate 2) may be a monolayer or a laminated multilayer formed by any one or more of molybdenum (Mo), molybdenum-niobium alloy (MoNb), aluminum (Al), aluminum-neodymium alloy (AlNd), titanium (Ti) and copper (Cu), and preferable, is a monolayer or a laminated multilayer film made of Mo and/or Al, or an alloy including Mo and Al.

In step S3, a gate insulating layer 3 is formed, on the substrate 10 after the step S2.

Figure 3:
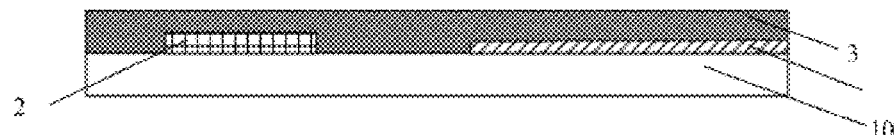
FIG. 3 is a schematic diagram showing step S3 of the method for manufacturing an array substrate according to the first embodiment of the present invention.

Specifically, in this step, the gate insulating layer 3 may be formed by thermal growth, atmospheric pressure chemical vapor deposition, low pressure chemical vapor deposition, plasma-assisted chemical vapor deposition, sputtering, or the like, as shown in FIG. 3.

Here, the gate insulating layer 3 may be made of silicon oxide (SiOx), silicon nitride (SiNx), hafnium oxide (HfOx), silicon oxynitride (SiON), aluminum oxide (AlOx), or the like, or may include a multilayer formed by two or three of silicon oxide (SiOx), silicon nitride (SiNx), hafnium oxide (HfOx), silicon oxynitride (SiON) and aluminum oxide (AlOx).

In step S4, an active-layer film and a source-drain metal film are sequentially formed on the substrate after the step S3, and a pattern including an active layer 4, a source 51 and a drain 52 of the thin film transistor is formed by a patterning process.

Figure 4:
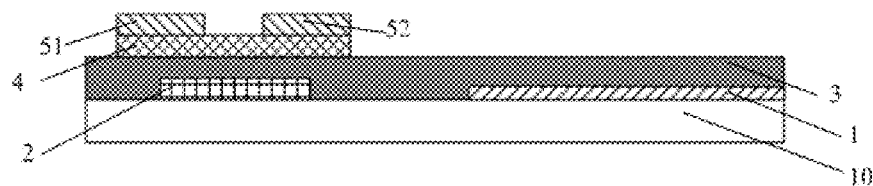
FIG. 4 is a schematic diagram showing step S4 of the method for manufacturing an array substrate according to the first embodiment of the present invention.

Specifically, in this step, the active-layer film may be first deposited by plasma enhanced chemical vapor deposition or low pressure chemical vapor deposition; next, the source-drain metal film may be formed by sputtering, thermal evaporation, plasma enhanced chemical vapor deposition, low pressure chemical vapor deposition, atmospheric pressure chemical vapor deposition or electron cyclotron resonance chemical vapor deposition; and then the pattern including the active layer 4, the source 51 and the drain 52 is formed by a single patterning process (including film forming, exposure, development, wet etching or dry etching) using a halftone mask (HTM) or a gray tone mask (GTM), as shown in FIG. 4.

Here, the active-layer film may be made of amorphous silicon (a-Si) or polysilicon (p-Si); the source-drain metal film (the source 51 and the drain 52) may be a monolayer or a laminated multilayer formed by any one or more of molybdenum (Mo), molybdenum-niobium alloy (MoNb), aluminum (Al), aluminum-neodymium alloy (AlNd), titanium (Ti) and copper (Cu), and preferable, is a monolayer or a laminated multilayer film made of Mo and/or Al, or an alloy including Mo and Al.

Of course, in the step S4, the active layer 4, the source 51 and the drain 52 may be formed by two patterning processes. That is, the active layer 4 is formed by a patterning process, and the source 51 and the drain 52 are formed by another patterning process.

In step S5, a passivation layer 6 is formed on the substrate 10 after the step S4.

Specifically, in this step, the passivation layer 6 may be formed by thermal growth, atmospheric pressure chemical vapor deposition, low pressure chemical vapor deposition, plasma-assisted chemical vapor deposition, sputtering, or the like.

Here, the passivation layer 6 may be made of silicon oxide (SiOx), silicon nitride (SiNx), hafnium oxide (HfOx), silicon oxynitride (SiON), aluminum oxide (AlOx), or the like, or may be a multilayer film formed by two or three of silicon oxide (SiOx), silicon nitride (SiNx), hafnium oxide (HfOx), silicon oxynitride (SiON) and aluminum oxide (AlOx).

Figure 5:
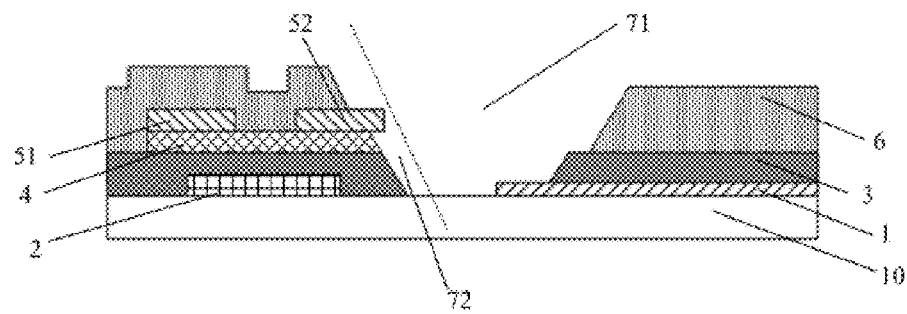
FIG. 5 is a schematic diagram showing steps S5 and S6 of the method for manufacturing an array substrate according to the first embodiment of the present invention.

In step S6, on the substrate 10 after the step S5, a pattern including a main via 71 penetrating through the gate insulating layer 3 and the passivation layer 6 and a main-via extension portion 72 is formed by a patterning process, wherein the main via 71 is connected to the main-via extension portion 72, as shown in FIG. 5. It should be noted that, the main-via extension portion 72 refers to a via that is inevitably formed by etching portions of the active layer 4 and the gate insulating layer 3 under the drain 52 during formation of the main via 71 by a patterning process. That is, the main-via extension portion 72 refers to a portion defined by a lower surface of the drain 52, right side surfaces of the active layer 4 and the gate insulating layer 3, an upper surface of the substrate 10, and a dashed line in FIG. 5.

Figure 8:
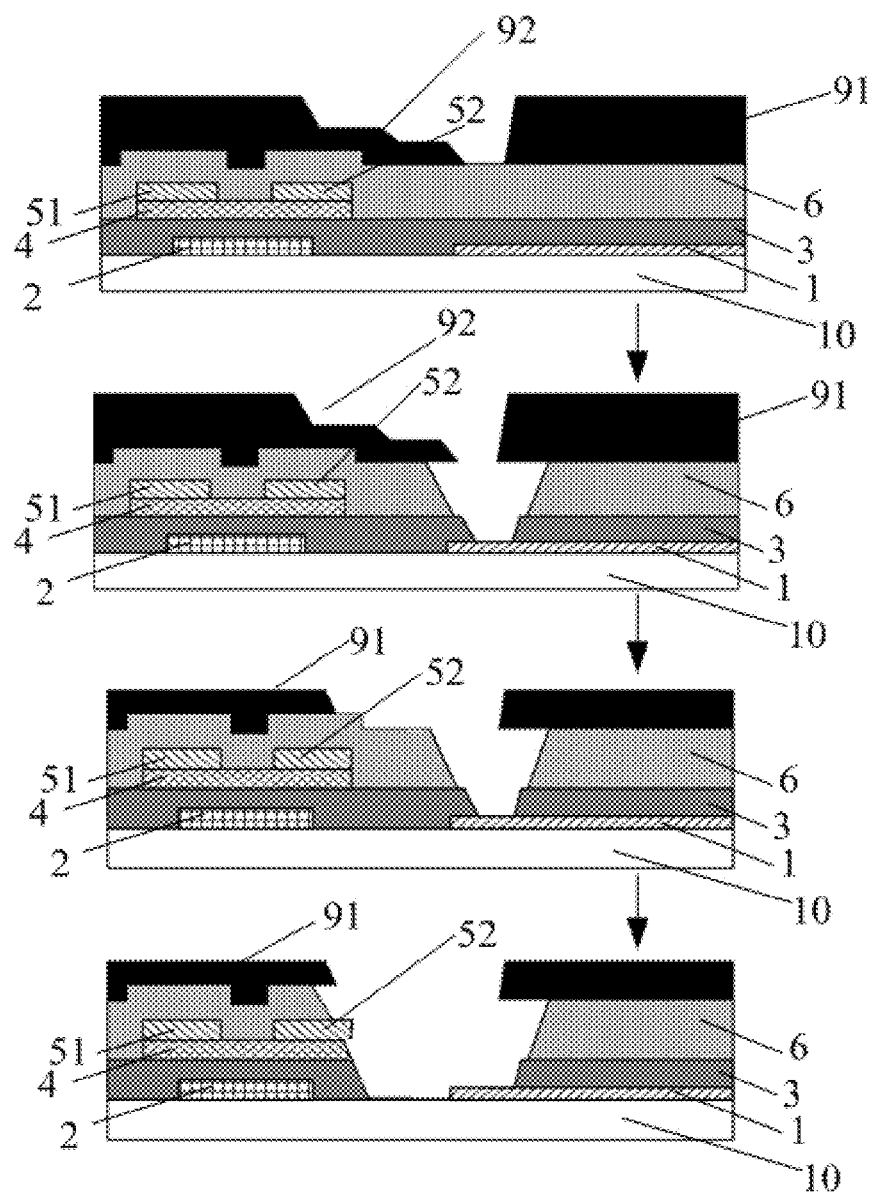
FIG. 8 is a schematic diagram showing specific steps of the step S6 of the method for manufacturing an array substrate according to the first embodiment of the present invention.

Specifically, the array substrate is divided into a thin film transistor region (i.e., a region corresponding to the position of the thin film transistor), a common electrode region and a via region between the thin film transistor region and the common electrode region. As shown in FIG. 8, the step S6 specifically includes the following steps S61 to S66.

In step S61, a layer of first photoresist is formed on the passivation layer 6.

In step S62, the layer of first photoresist is exposed by using a halftone mask or a grayscale mask and is developed, so that the layer of first photoresist is divided into a first photoresist completely removed region (not shown in the figures), a first photoresist completely remaining region 91 and a first photoresist partially remaining region 92. The first photoresist completely removed region corresponds to a central portion of the via region, the first photoresist partially remaining region 92 corresponds to a portion of a drain region of the thin film transistor region close to the via region and a peripheral region of the via region close to the thin film transistor region, the first photoresist completely remaining region 91 corresponds to the remaining region including the first region (corresponding to the position of a common electrode 81 to be formed later) of the common electrode region and a portion of the thin film transistor region. After development is performed, a thickness of the first photoresist in the first photoresist completely remaining region 91 remains unchanged, the first photoresist in the first photoresist completely removed region is removed completely, and a thickness of the first photoresist in the first photoresist partially remaining region 92 is decreased. The layer of first photoresist may have a thickness ranging from 2.2 μm to 2.5 μm. After the development is performed, a thickness of the first photoresist in the first photoresist partially remaining region 92 ranges from 1 μm to 1.5 μm.

In step S63, portions of the passivation layer 6 and the gate insulating layer 3 under the first photoresist completely removed region are removed by an etching process, specifically by a dry etching process.

In step S64, the first photoresist in the first photoresist partially remaining region 92 is removed by an ashing process, so as to expose a portion of the passivation layer 6 under the first photoresist partially remaining region 92 and the peripheral region of the via region close to the thin film transistor region.

In step S65, portions of the passivation layer 6, the active layer 4 and the gate insulating layer 3 under the first photoresist partially remaining region 92 are sequentially removed by an etching process (specifically by a dry etching process), so as to form the pattern including the main via 71 and the main-via extension portion 72. At this time, a portion of the drain 52 protrudes above the main-via extension portion 72.

In step S66, the remaining first photoresist is removed.

Here, it should be noted that, the main-via extension portion 72 is not formed deliberately. Because the active layer 4 is generally made of polysilicon or amorphous silicon, a portion of the active layer 4 in contact with the passivation layer 6 and the gate insulating layer 3 is etched inevitably during etching of the passivation layer 6 and the gate insulating layer 3, which results in the occurrence of the main-via extension portion 72 under the drain 52. The main-via extension portion 72 formed through exposure with a halftone mask or a grayscale mask in the above steps will have a small size, which alleviates the defect of undercut occurring under the drain 52 to a certain degree, but cannot eliminate this defect completely.

Of course, the main via 71 may be formed by an etching process using a general mask. However, in this case, the main-via extension portion 72 has a large size, and the undercut occurring under the drain 52 is very obvious.

Figure 6:
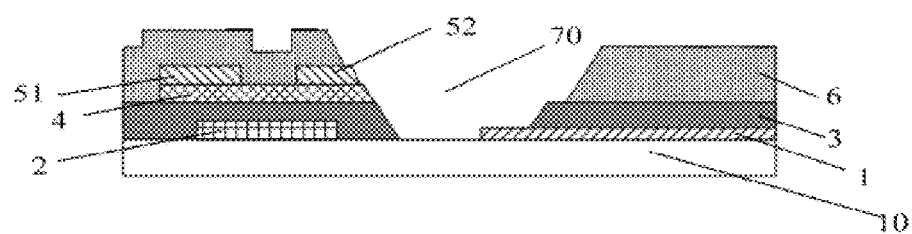
FIG. 6 is a schematic diagram showing step S7 of the method for manufacturing an array substrate according to the first embodiment of the present invention.

In step S7, on the substrate 10 after the step S6, a portion of the drain 52 protruding above the main-via extension portion 72 is removed by a single patterning process so as to form a pattern including a final via (including the main via 71 and the main-via extension portion 72), as shown in FIG. 6. Here, the portion of the drain 52 protruding above the main-via extension portion 72 refers to a portion of the drain 52, under which undercut occurs due to that the active layer 4 is partially etched. A wet etching process is employed in the step S7.

Figure 7:
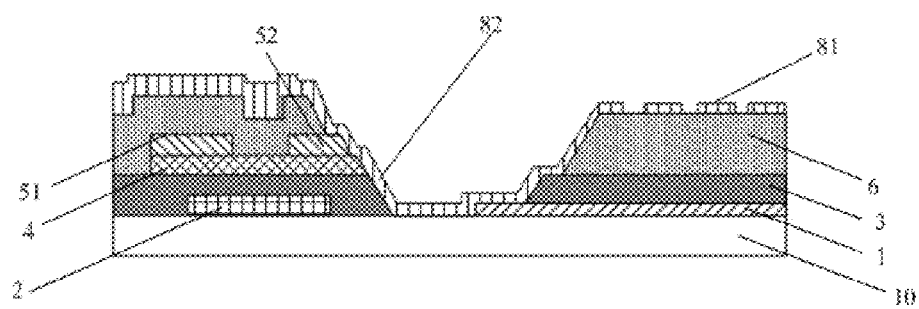
FIG. 7 is a schematic diagram showing step S8 of the method for manufacturing an array substrate according to the first embodiment of the present invention.

In step S8, a pattern including a connection electrode 82 and the common electrode 81 is formed on the substrate 10 after the step S7, wherein the connection electrode 82 electrically connects the drain 52 to the pixel electrode 1 through the final via, as shown in FIG. 7.

Figure 9:
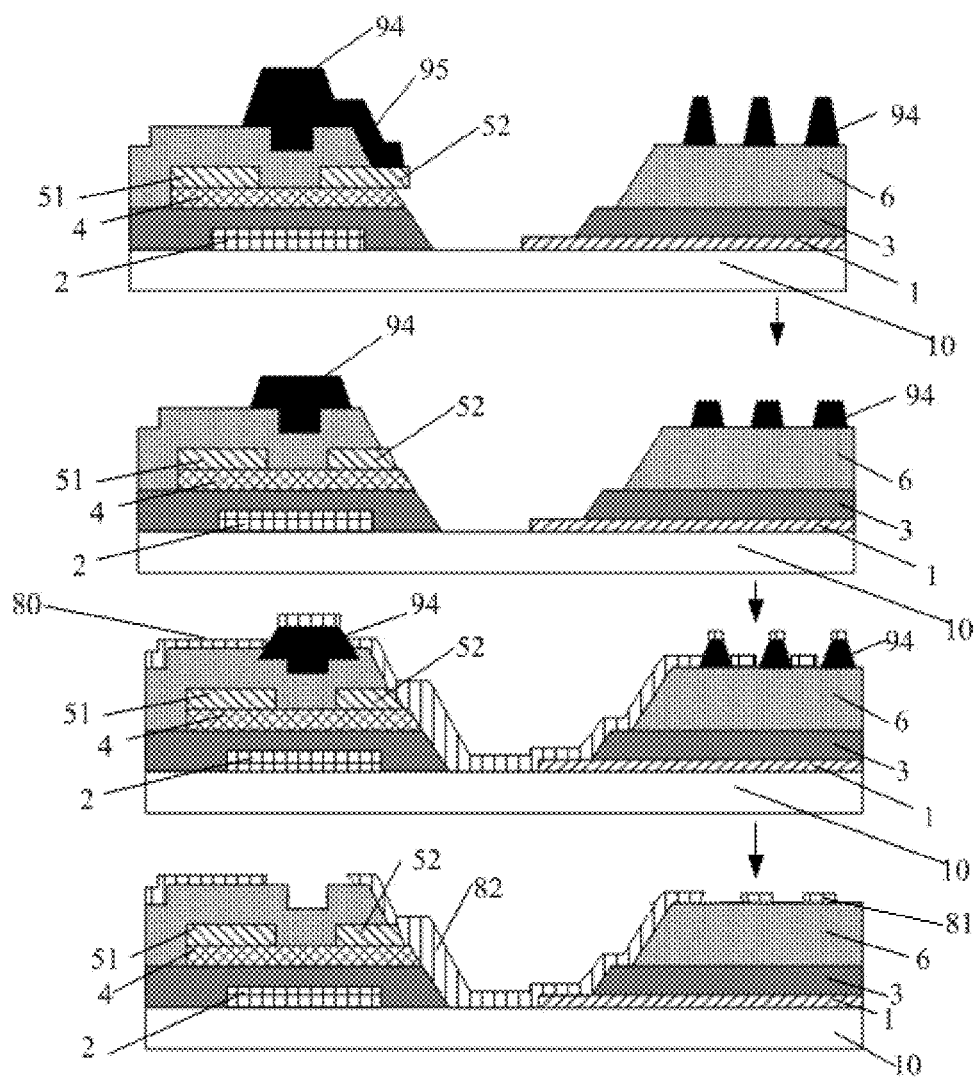
FIG. 9 is a schematic diagram showing specific steps of the step S8 of the method for manufacturing an array substrate according to the first embodiment of the present invention.

Specifically, the common electrode region includes a first region (i.e., a region corresponding to the position of the common electrode 81) and a second region (i.e., a region corresponding to the position of an interval between two adjacent common electrodes 81) which are arranged alternately. As shown in FIG. 9, the step S8 specifically includes the following steps S81 to S86.

In step S81, a layer of second photoresist is formed on the substrate provided with the pattern including the main via 71 and the main-via extension portion 72.

In step S82, the layer of second photoresist is exposed with a halftone mask or a grayscale mask and is developed, so that the layer of second photoresist is divided into a second photoresist completely removed region (not shown in the figures), a second photoresist completely remaining region 94 and a second photoresist partially remaining region 95. The second photoresist completely removed region corresponds to a source region of the thin film transistor region, the via region and the second region of the common electrode region, the second photoresist partially remaining region 95 corresponds to a drain region of the thin film transistor region, and the second photoresist completely remaining region 94 corresponds to the remaining region. After development is performed, a thickness of the second photoresist in the second photoresist completely remaining region 94 remains unchanged, the second photoresist in the second photoresist completely removed region is removed completely, and a thickness of the second photoresist in the second photoresist partially remaining region 95 is decreased. The layer of second photoresist may have a thickness ranging from 2.5 µm to 3.0 µm. After the development is performed, a thickness of the second photoresist in the second photoresist partially remaining region 95 ranges from 0.5 µm to 1.0 µm.

In step S83, a portion of the drain 52 protruding above the main-via extension portion 72 is removed by an etching process (specifically by a wet etching process), so as to form the pattern including the final via (including the main via 71 and the main-via extension portion 72).

In step S84, the second photoresist in the second photoresist partially remaining region 95 is removed by an ashing process.

In step S85, a transparent conductive film (i.e., a second transparent conductive film) 80 is deposited. The transparent conductive film 80 may have a structure of ITO/Ag/ITO or Ag/ITO. Alternatively, the ITO in the above structure may be replaced by any one of IZO, IGZO and InGaSnO.

In step S86, the remaining second photoresist is removed by a stepped stripping process, and the pattern including the common electrode 81 and the connection electrode 82 is formed.

In this way, the array substrate is manufactured.

The method for manufacturing an array substrate according to the present embodiment effectively solves the problem of undercut occurring under a drain without adding any process step, and the manufactured array substrates have a better performance and a higher yield.

Correspondingly, a second embodiment of the present invention provides array substrate, which is manufactured by the method for manufacturing an array substrate according to the first embodiment, and has a better performance.

Correspondingly, a third embodiment of the present invention provides a display device including the array substrate according to the second embodiment. The display device may be any product or component having a display function, such as a liquid crystal panel, electronic paper, a mobile phone, a tablet computer, a television set, a display, a laptop computer, a digital photo frame, a navigator, or the like.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

What is claimed is:

1. A method for manufacturing an array substrate, comprising:
    step S1, forming a pattern comprising a pixel electrode on a substrate;
    step S2, forming a pattern comprising a gate of a thin film transistor on the substrate after the step S1;
    step S3, forming a gate insulating layer on the substrate after the step S2;
    step S4, forming a pattern comprising an active layer and a source and a drain, which are provided on the active layer, of the thin film transistor on the substrate by a patterning process after the step S3;
    step S5, forming a passivation layer on the substrate after the step S4;
    step S6, forming, on the substrate, a pattern comprising a main via penetrating through the gate insulating layer and the passivation layer and a main-via extension portion under a portion of the drain by a patterning process after the step S5, wherein the main via is connected to the main-via extension portion;
    step S7, removing a portion of the drain which protrudes above the main-via extension portion after the step S6, so as to form a pattern comprising a final via; and
    step S8, forming a pattern comprising a connection electrode and a common electrode on the substrate after the step S7, wherein the connection electrode electrically connects the drain to the pixel electrode through the final via.

2. The method for manufacturing an array substrate according to claim 1, wherein, the array substrate comprises a thin film transistor region, a common electrode region and a via region between the thin film transistor region and the common electrode region, and the step S6 comprises steps of:
    forming a layer of first photoresist on the substrate on which the passivation layer is formed;
    exposing the layer of first photoresist with a halftone mask or a grayscale mask such that the layer of first photoresist is divided into a first photoresist completely removed region, a first photoresist completely remaining region and a first photoresist partially remaining region, wherein, the first photoresist completely removed region corresponds to a central portion of the via region, the first photoresist partially remaining region corresponds to a portion, which is close to the via region, of a drain region of the thin film transistor region and a peripheral region, which is close to the thin film transistor region, of the via region, and the first photoresist completely remaining region corresponds to the remaining region; after development is performed, a thickness of the first photoresist in the first photoresist completely remaining region remains unchanged, the first photoresist in the first photoresist completely removed region is removed completely, and a thickness of the first photoresist in the first photoresist partially remaining region is decreased;

removing portions, which are under the first photoresist completely removed region, of the passivation layer and the gate insulating layer by an etching process;

removing, by an ashing process, the first photoresist in the first photoresist partially remaining region, so as to expose a portion of the passivation layer under the first photoresist partially remaining region and the peripheral region of the via region close to the thin film transistor region;

removing portions, which are under the first photoresist partially remaining region, of the passivation layer, the active layer and the gate insulating layer by an etching process, so as to form the pattern comprising the main via and the main-via extension portion; and removing the remaining first photoresist.

3. The method for manufacturing an array substrate according to claim 2, wherein, the layer of first photoresist has a thickness ranging from 2.2 μm to 2.5 μm.

4. The method for manufacturing an array substrate according to claim 2, wherein, both the step of removing portions, which are under the first photoresist completely removed region, of the passivation layer and the gate insulating layer by an etching process and the step of removing portions, which are under the first photoresist partially remaining region, of the passivation layer, the active layer and the gate insulating layer by an etching process are each performed by a dry etching process.

5. The method for manufacturing an array substrate according to claim 1, wherein, the step S7 comprises a step of:

removing, on the substrate provided with the pattern comprising the main via and the main-via extension portion, the portion of the drain which protrudes above the main-via extension portion so as to form the pattern comprising the final via by a single patterning process.

6. The method for manufacturing an array substrate according to claim 1, wherein, the step S8 comprises steps of:

forming a transparent conductive film, and forming the pattern comprising the connection electrode and the common electrode by a single patterning process.

7. The method for manufacturing an array substrate according to claim 1, wherein, the common electrode region comprises a first region and a second region arranged alternately, and the step S8 comprises steps of:

forming a layer of second photoresist on the substrate provided with the pattern comprising the main via and the main-via extension portion;

exposing the layer of second photoresist with a halftone mask or a grayscale mask such that the layer of second photoresist is divided into a second photoresist completely removed region, a second photoresist completely remaining region and a second photoresist partially remaining region, wherein, the second photoresist completely removed region corresponds to a source region of the thin film transistor region, the via region and the second region of the common electrode region, the second photoresist partially remaining region corresponds to a drain region of the thin film transistor region, and the second photoresist completely remaining region corresponds to the remaining region comprising the first region; after development is performed, a thickness of the second photoresist in the second photoresist completely remaining region remains unchanged, the second photoresist in the second photoresist completely removed region is removed completely, and a thickness of the second photoresist in the second photoresist partially remaining region is decreased;

removing a portion, which protrudes above the main-via extension portion, of the drain by an etching process, so as to form the pattern comprising the final via;

removing, by an ashing process, the second photoresist in the second photoresist partially remaining region;

forming a transparent conductive film on the substrate after the step of removing, by an ashing process, the second photoresist in the second photoresist partially remaining region; and removing the remaining second photoresist by a stepped stripping process, and forming the pattern comprising the connection electrode and the common electrode.

8. The method for manufacturing an array substrate according to claim 7, wherein, the layer of second photoresist has a thickness ranging from 2.5 μm to 3.0 μm.

9. The method for manufacturing an array substrate according to claim 1, wherein, the step S4 comprises steps of:

depositing an active-layer film and a source-drain metal film sequentially; and forming the pattern comprising the active layer and the source and the drain, which are provided on the active layer, of the thin film transistor by a single patterning process using a grayscale mask or a halftone mask.

10. The method for manufacturing an array substrate according to claim 1, wherein, the step S4 comprises steps of:

depositing an active-layer film, and forming a pattern comprising the active layer of the thin film transistor by a patterning process; and depositing a source-drain metal film, and forming a pattern comprising the source and the drain of the thin film transistor by another patterning process.

11. An array substrate, manufactured by the method for manufacturing an array substrate according to claim 1.

12. A display device, comprising the array substrate according to claim 11.

13. The method for manufacturing an array substrate according to claim 2, wherein, the step S7 comprises a step of:

removing, on the substrate provided with the pattern comprising the main via and the main-via extension portion, the portion of the drain which protrudes above the main-via extension portion so as to form the pattern comprising the final via by a single patterning process.

14. The method for manufacturing an array substrate according to claim 2, wherein, the step S8 comprises steps of:

forming a transparent conductive film, and forming the pattern comprising the connection electrode and the common electrode by a single patterning process.

15. The method for manufacturing an array substrate according to claim 2, wherein, the common electrode region comprises a first region and a second region arranged alternately, and the step S8 comprises steps of:
   forming a layer of second photoresist on the substrate provided with the pattern comprising the main via and the main-via extension portion;
   exposing the layer of second photoresist with a halftone mask or a grayscale mask such that the layer of second photoresist is divided into a second photoresist completely removed region, a second photoresist completely remaining region and a second photoresist partially remaining region, wherein, the second photoresist completely removed region corresponds to a source region of the thin film transistor region, the via region and the second region of the common electrode region, the second photoresist partially remaining region corresponds to a drain region of the thin film transistor region, and the second photoresist completely remaining region corresponds to the remaining region comprising the first region; after development is performed, a thickness of the second photoresist in the second photoresist completely remaining region remains unchanged, the second photoresist in the second photoresist completely removed region is removed completely, and a thickness of the second photoresist in the second photoresist partially remaining region is decreased;
   removing a portion, which protrudes above the main-via extension portion, of the drain by an etching process, so as to form the pattern comprising the final via;
   removing, by an ashing process, the second photoresist in the second photoresist partially remaining region;
   forming a transparent conductive film on the substrate after the step of removing, by an ashing process, the second photoresist in the second photoresist partially remaining region; and
   removing the remaining second photoresist by a stepped stripping process, and forming the pattern comprising the connection electrode and the common electrode.

16. The method for manufacturing an array substrate according to claim 2, wherein, the step S4 comprises steps of:
   depositing an active-layer film and a source-drain metal film sequentially; and
   forming the pattern comprising the active layer and the source and the drain, which are provided on the active layer, of the thin film transistor by a single patterning process using a grayscale mask or a halftone mask.

17. The method for manufacturing an array substrate according to claim 3, wherein, the step S4 comprises steps of:
   depositing an active-layer film and a source-drain metal film sequentially; and
   forming the pattern comprising the active layer and the source and the drain, which are provided on the active layer, of the thin film transistor by a single patterning process using a grayscale mask or a halftone mask.

18. The method for manufacturing an array substrate according to claim 4, wherein, the step S4 comprises steps of:
   depositing an active-layer film and a source-drain metal film sequentially; and
   forming the pattern comprising the active layer and the source and the drain, which are provided on the active layer, of the thin film transistor by a single patterning process using a grayscale mask or a halftone mask.

19. The method for manufacturing an array substrate according to claim 5, wherein, the step S4 comprises steps of:
   depositing an active-layer film and a source-drain metal film sequentially; and
   forming the pattern comprising the active layer and the source and the drain, which are provided on the active layer, of the thin film transistor by a single patterning process using a grayscale mask or a halftone mask.

20. The method for manufacturing an array substrate according to claim 2, wherein, the step S4 comprises steps of:
   depositing an active-layer film, and forming a pattern comprising the active layer of the thin film transistor by a patterning process; and
   depositing a source-drain metal film, and forming a pattern comprising the source and the drain of the thin film transistor by another patterning process.

* * * * *